United States Patent
Schneegans et al.

(10) Patent No.: US 9,887,170 B2
(45) Date of Patent: Feb. 6, 2018

(54) MULTI-LAYER METAL PADS

(71) Applicant: Infineon Technologies AG, Neubiberg (DE)

(72) Inventors: Manfred Schneegans, Vaterstetten (DE); Bernhard Weidgans, Bernhardswald (DE); Franziska Haering, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/592,941

(22) Filed: May 11, 2017

(65) Prior Publication Data

US 2017/0317042 A1 Nov. 2, 2017

Related U.S. Application Data

(63) Continuation of application No. 15/141,571, filed on Apr. 28, 2016, now Pat. No. 9,666,546.

(51) Int. Cl.
*H01L 23/52* (2006.01)
*H01L 23/00* (2006.01)

(52) U.S. Cl.
CPC .............. *H01L 24/06* (2013.01); *H01L 24/03* (2013.01); *H01L 24/05* (2013.01); *H01L 2224/03462* (2013.01); *H01L 2224/05087* (2013.01); *H01L 2224/05093* (2013.01); *H01L 2224/05098* (2013.01); *H01L 2224/05147* (2013.01); *H01L 2224/0603* (2013.01); *H01L 2224/065* (2013.01); *H01L 2924/35121* (2013.01)

(58) Field of Classification Search
CPC ... H01L 2224/32104; H01L 2224/0603; H01L 24/06; H01L 24/09; H01L 2225/06524; H01L 24/33
USPC ........ 257/758, 691, 723, 724, 784; 438/622, 438/624, 625
See application file for complete search history.

(56) References Cited

U.S. PATENT DOCUMENTS

| | | |
|---|---|---|
| 6,143,640 A | 11/2000 | Cronin et al. |
| 7,282,447 B2 | 10/2007 | Dennison et al. |
| 2008/0164588 A1 | 7/2008 | Lee et al. |
| 2009/0079080 A1 | 3/2009 | Stecher |
| 2009/0231827 A1* | 9/2009 | Furutani ........... H01L 23/49822 361/820 |
| 2010/0047990 A1 | 2/2010 | Edelstein et al. |
| 2011/0031608 A1 | 2/2011 | Kim et al. |
| 2013/0105956 A1 | 5/2013 | Jo et al. |
| 2013/0228929 A1 | 9/2013 | Meinhold et al. |
| 2015/0287745 A1 | 10/2015 | Kato |

(Continued)

*Primary Examiner* — S. V. Clark
(74) *Attorney, Agent, or Firm* — Slater Matsil, LLP

(57) ABSTRACT

A method for fabricating a semiconductor device includes forming a conductive liner over a first landing pad in a first region and over a second landing pad in a second region. The method further includes depositing a first conductive material within first openings within a resist layer formed over the conductive liner. The first conductive material overfills to form a first pad and a first layer of a second pad. The method further includes depositing a second resist layer over the first conductive material, and patterning the second resist layer to form second openings exposing the first layer of the second pad without exposing the first pad. A second conductive material is deposited over the second layer of the second pad.

23 Claims, 14 Drawing Sheets

(56) References Cited

U.S. PATENT DOCUMENTS

| | | | |
|---|---|---|---|
| 2016/0254414 A1* | 9/2016 | Jung | H01L 33/42 |
| | | | 257/98 |
| 2017/0077348 A1* | 3/2017 | Lim | H01L 33/14 |
| 2017/0221727 A9* | 8/2017 | Zhang | H01L 21/32134 |
| 2017/0236977 A1* | 8/2017 | Oh | H01L 33/387 |
| | | | 257/13 |

* cited by examiner

MULTI-LAYER METAL PADS

CROSS-REFERENCE TO RELATED APPLICATIONS

This application is a continuation application of U.S. application Ser. No. 15/141,571 filed on Apr. 28, 2016, which application is hereby incorporated herein by reference.

TECHNICAL FIELD

The present invention relates generally to semiconductor devices, and, in particular embodiments, to multi-layer metal pads and method of making them.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

After fabricating various devices within a semiconductor substrate, these devices are interconnected through metal interconnects. Metal interconnects are formed over the device regions and are formed in multiple layers or levels called metallization levels. Metal interconnects were made of aluminum in traditional processes.

Technology scaling has required aggressively reducing the thicknesses of the metal interconnects in the lower metallization levels. The reduced thicknesses resulted in increased resistances of these metal lines. As a consequence, lower levels of metallization have been replaced by copper, which has a lower resistance.

Additionally, power devices have additional requirements. The current drawn through the pads is significantly higher in power devices. Such pads have to be thicker to improve heat dissipation and heat capacity. This increases the complexity of integrating thick copper into the uppermost metallization level.

SUMMARY

In accordance with an embodiment of the present invention, a method for fabricating a semiconductor device, the method includes forming a conductive liner over a first landing pad in a first region and over a second landing pad in a second region. The method further includes depositing a first conductive material within first openings within a resist layer formed over the conductive liner. The first conductive material overfills to form a first pad and a first layer of a second pad. The method further includes depositing a second resist layer over the first conductive material, and patterning the second resist layer to form second openings exposing the first layer of the second pad without exposing the first pad. The method further comprises depositing a second conductive material over the second layer of the second pad.

In accordance with an embodiment of the present invention, a method for fabricating a semiconductor device includes forming a conductive liner over a first landing pad in a first region and over a second landing pad in a second region, depositing a resist layer over the conductive liner, and patterning the resist layer to form first openings in the resist layer. The method further includes depositing a first conductive material within the first openings, the first conductive material overfilling to form a first pad and a first layer of a second pad. The method further includes depositing a etch stop liner over the first conductive material, depositing a second conductive material over the etch stop liner, and etching the second conductive material and the etch stop liner to form a second pad. The second pad includes a layer of the first conductive material and a layer of the second conductive material.

In accordance with an embodiment of the present invention, a semiconductor device includes a first region in a substrate that includes transistors and a second region in the substrate that includes power transistors. The power transistors are a part of a circuit for providing power to the transistors in the first region. A first pad is disposed over the first region. The first pad is coupled to the transistors in the first region, and a second pad is disposed over the second region. The second pad is coupled to the power transistors in the second region. The first pad includes a first portion of a first metal layer. The second pad includes a second portion of the first metal layer and a layer of a second metal layer disposed over the second portion of the first metal layer. The first metal layer includes a first conductive material, and the second metal layer includes a second conductive material. The layer of the second metal layer has a smaller foot print than the second portion of the first metal layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

By continuously shrinking the physical dimensions of the integrated circuit chip, performance enhancement, energy efficiency, and reduction in the production cost has been achieved. However, dissipation of the thermal energy is still a challenge. The major reason for this is the enormous increase in the current per unit area of the chip.

In conventional devices, the uppermost metal lines are made of aluminum. Therefore, metals such as copper are beginning to be used in uppermost metal layers, where the current density is highest. However, there are major problems associated with thick structured copper both during processing and later during the product lifetime that can negatively impact the life of the product.

Examples include problems associated with deposition of thick copper. For example, the maximum thickness that can be deposited is limited by the fine pitch structures. This is because copper is plated between patterned resist structures. In particular, the resist structures have to be thicker than the thickness of the copper being deposited. However, the maximum thickness of resist is limited in fine pitch structures. This limits the thickness of the metal in fine pitch structures, which are used over the functional circuit areas such as the logic, memory, and others. For example, the maximum thickness of copper that can be deposited is less than about 20 μm.

When the thickness of the copper is reduced to accommodate the fine pitch structures, the cooling ability of the semiconductor device is lowered. Power semiconductor devices generate a significant amount of heat that has to be extracted away from the device for proper functioning of the device. The inability to form thick power metal can result in a significant reduction in lifetime of the product.

Additionally, thick copper layers lead to high wafer bow because of the higher (intrinsic) stress due to mismatch of thermal expansion of metal layer relative to silicon. Such high stress can result in delamination of the entire pad. However, films that result in lower stress levels are typically poor for making electrical contact, for example, due to poor bonding with a wire bond.

Therefore, good heat dissipation by using thick power metal and good electrical contact traditionally require opposite conditions. Embodiments of the present invention overcome these and other issues by forming pads over multiple levels. A pad formed over multiple levels avoids the conflicting needs of heat dissipation and electrical connectivity.

Figure 1A:
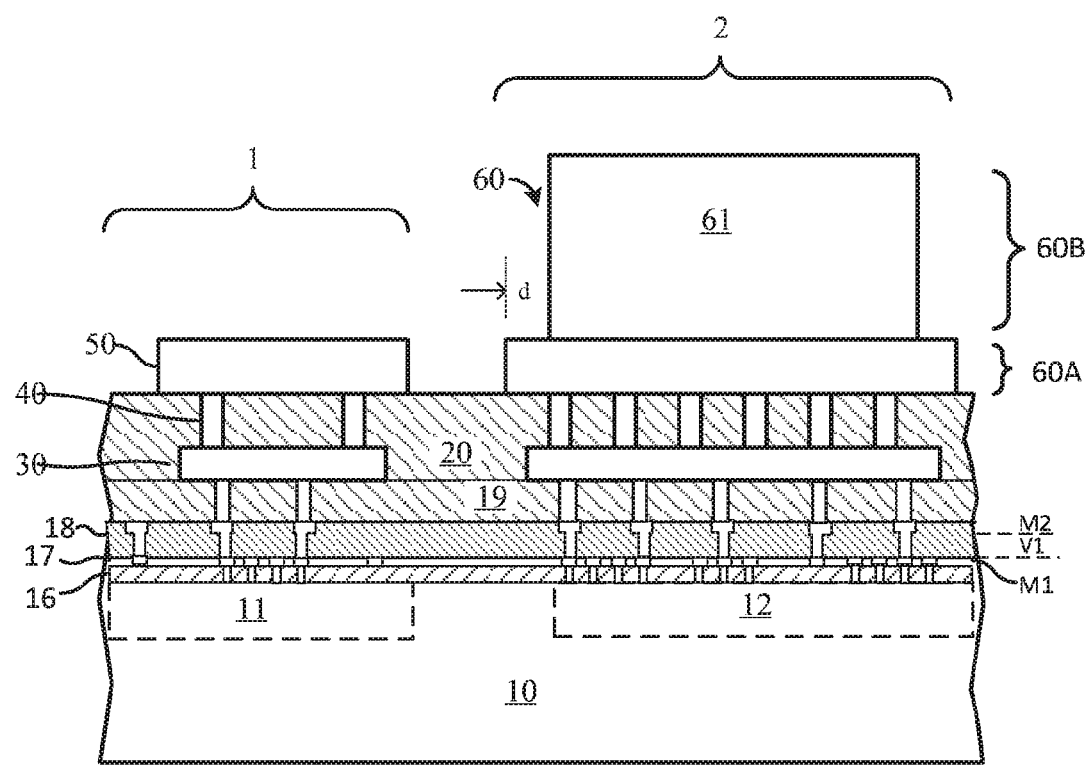
FIG. 1A illustrates a cross-sectional view of a semiconductor device in accordance with an embodiment of the present invention.
Figure 1B:
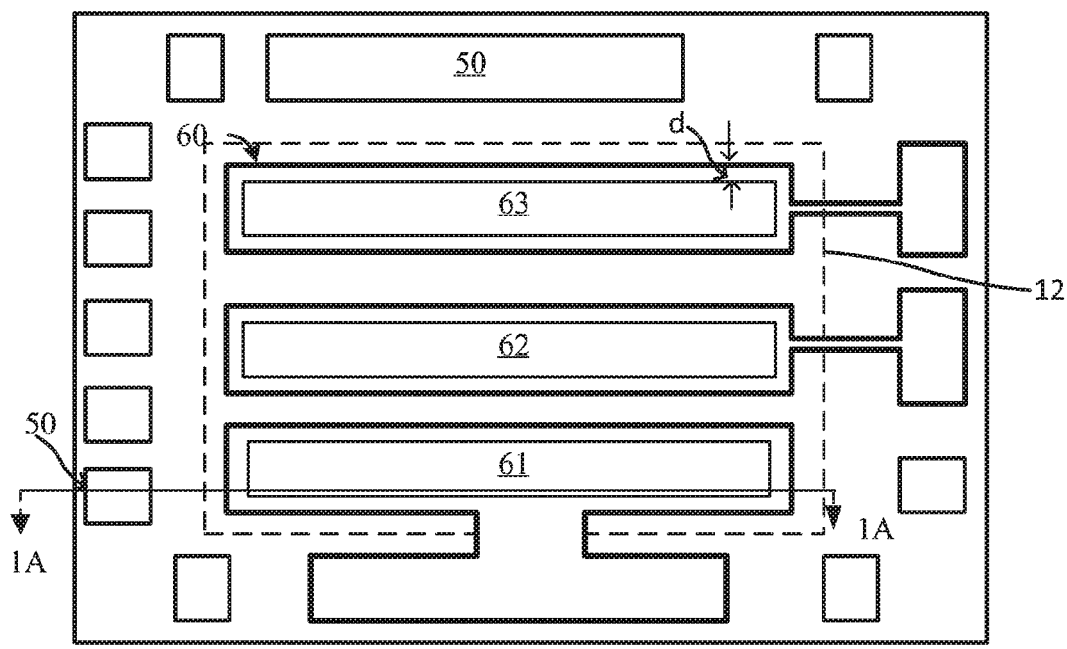
FIG. 1B illustrates a top view of the semiconductor device in accordance with an embodiment of the present invention.
Figure 2A:
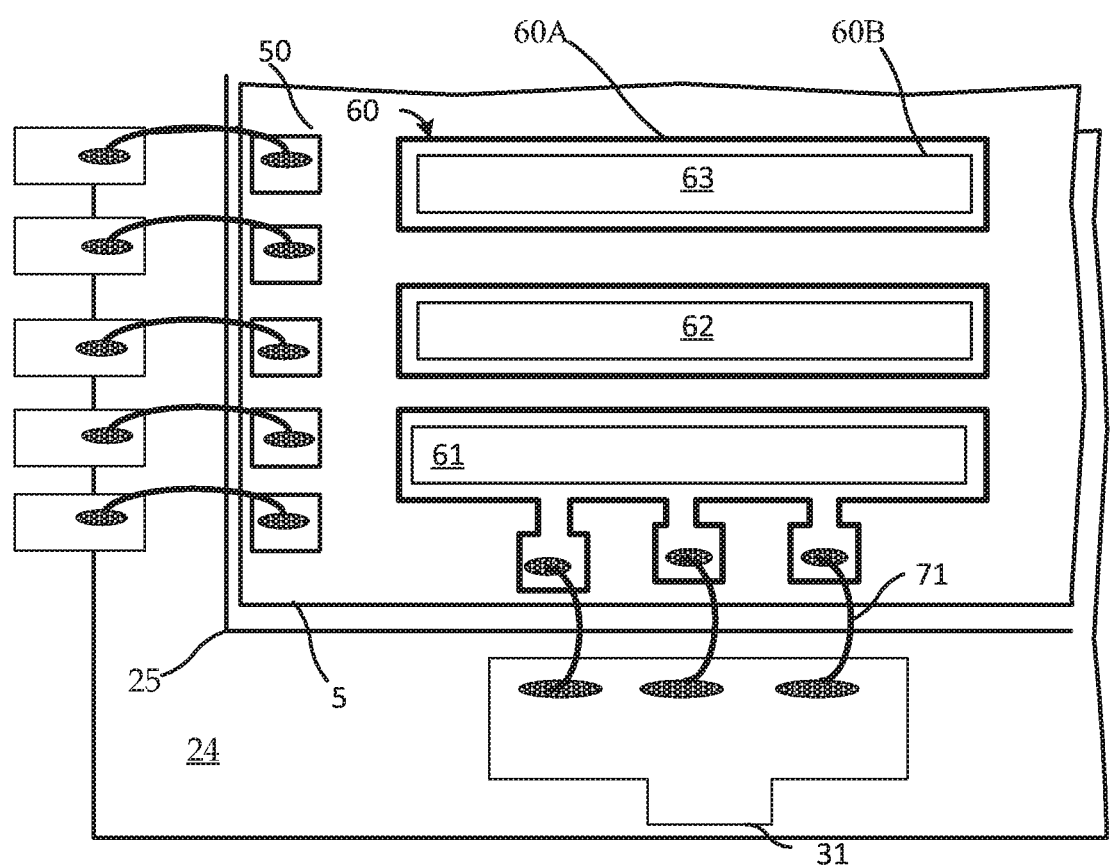
FIG. 2A illustrates a top view of a portion of a semiconductor device in accordance with an embodiment of the present invention.
Figure 2B:
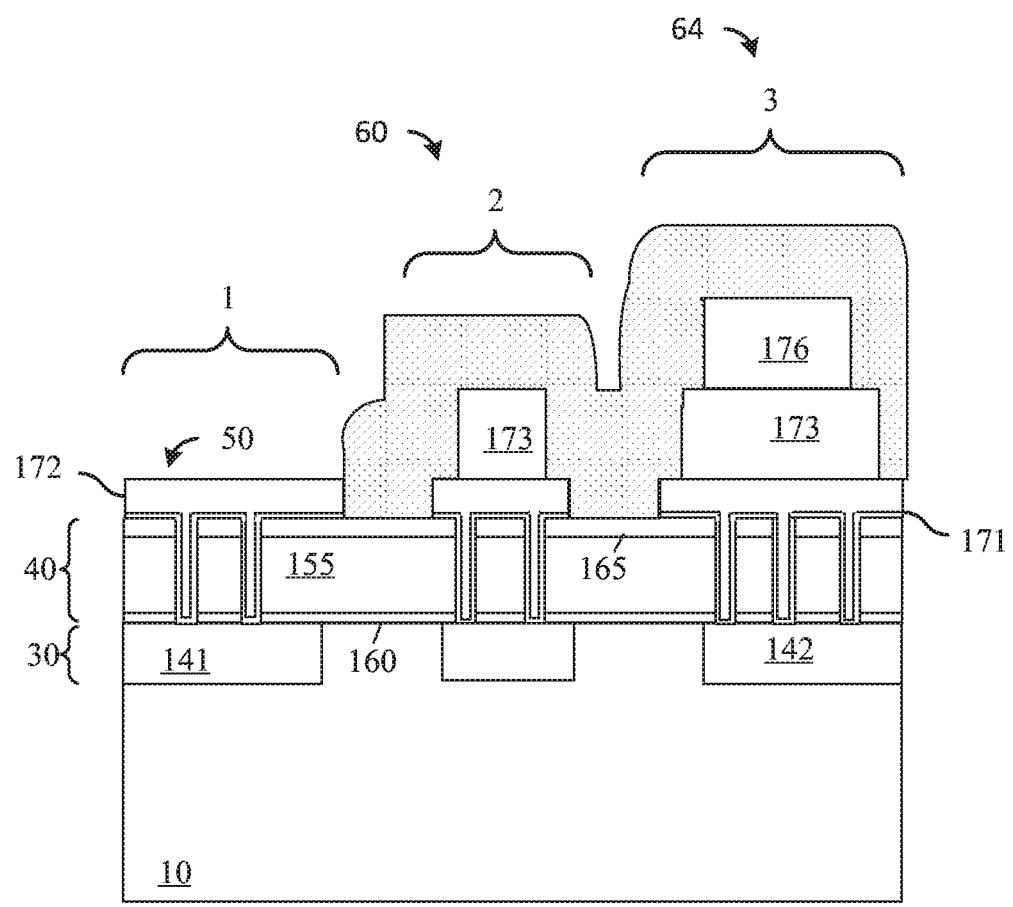
FIG. 2B illustrates a cross-sectional view of a portion of a semiconductor device in accordance with an alternative embodiment of the present invention.

FIGS. 1A and 1B will be used to describe a structural embodiment of the present invention. FIGS. 2A and 2B illustrate alternative structural embodiments of the present invention. Alternative embodiment of making the device will be described using FIGS. 3 and 4.

FIG. 1A illustrates a cross-sectional view of a semiconductor device in accordance with an embodiment of the present invention.

Referring to FIG. 1A, a semiconductor chip is arranged on a substrate 10. In various embodiments, the semiconductor chip may comprise an integrated circuit chip. In one or more embodiments, the semiconductor chip may comprise a logic chip, a memory chip, an analog chip, a mixed signal chip, and combinations thereof such as a system on chip, or other suitable types of devices. The semiconductor chip may comprise various types of active and passive devices such as diodes, transistors, thyristors, capacitors, inductors, resistors, optoelectronic devices, sensors, micro-electro-mechanical systems, and others.

In various embodiments, the semiconductor chip comprises different types of device regions. As illustrated, the semiconductor chip comprises a first region 1 comprising low power or standard voltage devices and a second region 2 comprising high voltage or power devices. The power devices of the second region 2 may comprise devices that operate at higher voltages and are generally used as input/output devices for providing power to the standard voltage devices. For example, the standard voltage devices may operate at threshold voltages of 0.8V to 1.8V while the power devices may operate at threshold voltages higher than 5 V.

In various embodiments, the semiconductor chip may be formed on a silicon substrate 10. The substrate 10 may include epitaxial layers including heteroepitaxial or homoepitaxial layers. Some examples of the substrate 10 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. Alternatively, in other embodiments, the semiconductor chip may have been formed on silicon carbide (SiC). In one embodiment, the semiconductor chip may have been formed at least partially on gallium nitride (GaN). For example, the semiconductor chip may be a lateral transistor formed on GaN on silicon. In another embodiment, the semiconductor chip may be a vertical transistor formed on GaN on bulk GaN substrate. In other embodiments, other semiconductors such as silicon germanium, germanium, gallium arsenide, indium arsenide, indium gallium arsenide, indium antimonide, indium phosphide, combinations thereof, or others can be used as the substrate 10.

The substrate 10 includes a first active device region 11 in the first region 1 and a second active device region 12 in the second region 2. The first active device region 11 may include doped regions forming a standard voltage transistor, for example. In contrast, the second active device region 12 may include doped regions forming a power device, for example, a drain extended metal oxide semiconductor (DMOS) transistor.

Next, metallization is disposed over the first and the second active device regions 11 and 12 to electrically contact and interconnect the active devices. The metallization and active device regions together form a completed functional integrated circuit. In other words, the electrical functions of the chip can be performed by the interconnected active circuitry. As an example, in logic devices, the metallization may include many layers, e.g., nine or more, of copper or alternatively of other metals.

Referring to FIG. 1A, for illustration, a first insulating layer 16 is disposed over the substrate 10. The first insulating layer 16 may comprise a etch stop layer such as silicon nitride, silicon oxynitride, and others in one or more embodiments.

The first insulating layer 16 comprises $SiO_2$ such (deposited using) as tetra ethyl oxysilane (TEOS) or fluorinated TEOS (FTEOS), but in various embodiments may comprise insulating materials typically used in semiconductor manufacturing for inter-level dielectric (ILD) layers, such as doped glass (BPSG, PSG, BSG), organo silicate glass (OSG), carbon doped oxides (CDO), fluorinated silicate glass (FSG), spin-on glass (SOG), or low-k insulating materials, e.g., having a dielectric constant of about 4 or less, or dielectric diffusion barrier layers or etch stop layers such as silicon nitride (SiN), silicon oxynitride (SiON), silicon carbide (SiC) or silicon carbo nitride (SiCN), e.g., having a dielectric constant of about 4 or higher or combinations or multiple layers thereof, as examples, although alternatively, the first insulating layer 16 may comprise other materials. The first insulating layer 16 may also comprise dense SiCOH or a porous dielectric having a k value of about 3 or lower, as examples. The first insulating layer 16 may also comprise an ultra-low-k (ULK) material having a k value of about 2.3 or lower, for example. The first insulating layer 16 may comprise a thickness of about 500 nm or less, for example, although alternatively, the first insulating layer 16 may comprise other dimensions.

A plurality of contact plugs is formed within the first insulating layer 16 to couple to various regions of the substrate 10 including the first active device region 11 and the second active device region 12. The plurality of contact plugs may be coupled to silicided regions of the substrate 10 as an example.

A second insulating layer 17 is disposed over the first insulating layer 16. A first metal level M1 is coupled to the plurality of contact plugs in the first insulating layer 16 and formed within a second insulating layer 17. The second insulating layer 17 may comprise an inter-level dielectric layer and may be suitably selected, for example, as described above for the first insulating layer 16.

A plurality of metal lines is formed within the second insulating layer 17 to form a first metal level M1. The metal lines may include a plurality of layers, for example, an adhesion layer, a metal barrier layer, e.g., to prevent the diffusion of copper into underlying layers, a seed layer for subsequent growth of the fill material, and the fill material.

Subsequent layers may be formed using a dual damascene process although in various embodiments a damascene process may also be used. For example, each level with a metal level and a via level comprises a dual-tier opening having an upper conductive line and a lower conductive via. The upper conductive line may be an opening such as a trench (but may also be a hole), and may be filled with a metal. Conductive via may be an opening such as a hole (but may also be a trench) and may be also filled with a metal.

The first via level V1 and the second metal level M2 may be formed within the third insulating layer 18 as a single structure. Similar to the first metal level M1, the single structure may comprise an adhesion layer, a metal barrier layer, a seed layer, and the fill material.

Further metal and via levels may be formed in additional insulating layers. For example, a plurality of vias is formed in a fourth insulating layer 19 over the third insulating layer 18.

A plurality of landing pads 30 are formed over the fourth insulating layer 19. The plurality of landing pads 30 may be embedded within a fifth insulating layer 20. The plurality of landing pads 30 may also include an adhesion layer, barrier layer, a seed layer, and a fill metal as in various embodiments. For example, a common adhesion and barrier layer comprising tungsten-titanium may be used while the seed layer may be a copper layer and/or additional functional layers, and the fill material may be electroplated copper in one embodiment.

A plurality of vias 40 are formed over the plurality of landing pads 30 and couple the plurality of landing pads 30 to a plurality of pads that comprise a first type of pad 50 and a second type of pad 60. The first type of pad 50 is formed over the standard voltage regions such as the first active device region 11 while the second type of pad 60 is formed over the power devices in the second active device region 12. In various embodiments, the first type of pad 50 is at a different height relative to the second type of pad 60. The second type of pad 60 is much thicker than the first type of pad 50.

In various embodiments, the first type of pad 50 is about 5 μm to about 15 μm, for example, 10 μm to 12 μm in one embodiment. In various embodiments, the second type of pad 60 is about 20 μm to about 50 μm, for example, 25 μm to 35 μm in one embodiment.

As further illustrated in FIG. 1A, the second type of pad 60 includes a first layer 60A and a second layer 60B. The first layer 60A has the same composition as the first type of pad 50 in the first region 1 whereas the second layer 60B has a different composition than the first type of pad 50.

Further, as illustrated in FIG. 1A, the second layer 60B has a smaller footprint than the first layer 60A directly underneath the second layer 60B. For example, along a critical dimension parallel to the major surface of the substrate 10, the second layer 60B is smaller than the first layer 60A by twice the distance d. In various embodiments, the distance d is at least half a micron. In one or more embodiments, the distance d is about 1 micron to 10 (2) micron. Accordingly, the footprint (area overlapped over the substrate 10) of the second layer 60B is smaller than the footprint of the first layer 60A.

In various embodiments, the first layer 60A is a different type of material than the second layer 60B. In one embodiment, the first layer 60A may comprise a copper layer while the second layer 60B may comprise different types of copper material layer.

The second layer 60B is more porous than the first layer 60A in one or more embodiments. In one embodiment, the first layer 60A is ten times denser than the second layer 60B, which comprises voids. For example, the percent porosity and the number of voids may be adjusted depending on the deposition method and the material system being used. For example, the first layer 60A may have less than 1% pores by volume while the second layer 60B may have pores larger than 5% by volume, and in one embodiment between 5% to 50% by volume.

In various embodiments, the second layer 60B has a different composition than the first layer 60A. In one embodiment, the first layer 60A may comprise a heavily doped copper layer while the second layer 60B may comprise less doping. Doping or alloying could increase the stability or toughness of the first layer 60A whereas the second layer 60B is used only as a proper heat capacitor or heat dissipator. In one embodiment, the second layer 60B has larger grains than the grains of the first layer 60A. The second layer 60B may be deposited using a different electrochemical additive in one embodiment, which may vary the sulfuric component within the deposited first layer 60A and the second layer 60B. In other words, the first layer 60A has a different sulfuric content than the second layer 60B in various embodiments.

FIG. 1B illustrates a top view of the semiconductor device in accordance with an embodiment of the present invention.

The semiconductor chip comprises a plurality of pads on the major surface. In conventional chips, all pads are at the same surface, i.e., co-planar. However, in embodiments of the present invention, the pads coupled to the first active device region 11 are at a lower surface than the pads coupled to the second active device region 12. For example, the first pad 61, the second pad 62, and the third pad 63 of the second type of pads 60 are thicker than all the other pads, which are all the first type of pads 50. However, as is clear from FIG. 1B and described further below, the electrical contact pads of both the first type of pads 50 and the second type of pads 60 are still at the same plane.

As is clear from FIGS. 1A and 1B, the second type of pads 60 includes a portion for electrical contacting, i.e., a contact pad, and a portion for cooling, i.e., a cooling pad. By separating the contact pad into separate components based on functionality, embodiments of the present invention are able to design devices with better heat dissipation than conventional devices while maintaining excellent electrical connectivity.

FIG. 2A illustrates a top view of a portion of a semiconductor device in accordance with an embodiment of the present invention.

FIG. 2A illustrates a packaged semiconductor device in accordance with an embodiment of the present invention. Referring to FIG. 2A, a semiconductor die 5 is arranged on a substrate. The package substrate 25 may be a conductive substrate in some examples. For instance, the package substrate 25 may comprise copper in one embodiment. In other embodiments, the package substrate 25 comprises a metallic material which may include conductive metals and their alloys. The package substrate 25 may also include intermetallic material. In another alternative embodiment, the package substrate 25 may not be conductive. In still other embodiments, several different or identical semiconductor dies 5 may be attached on the package substrate 25 by different techniques.

The package substrate 25 may comprise a lead frame in one embodiment. For example, in one embodiment, the package substrate 25 may comprise a die paddle over which the semiconductor die 5 may be attached. In further embodiments, the package substrate 25 may comprise one or more die paddles over which one or more dies may be attached.

A plurality of leads 31 is disposed around the semiconductor die 5. A plurality of wires 71 electrically connects the first type of pad 50 and the second type of pad 60 to the plurality of leads 31.

As illustrated in FIG. 2A, the second type of pad 60 has a first layer 60A and a second layer 60B, e.g., as described using FIG. 1A. The second layer 60B may be used only as a heat sink while the first layer 60A may be used as an electrical contact pad. This may be because the first layer 60A comprises dense material that provides good electrical contact while the second layer 60B comprises a porous material that provides good heat dissipation but may not form a good electrical contact or wire bond with the wires 71. Accordingly, the first layer 60A may include a pad region that may be used for bonding with the wires 71.

In one embodiment, the plurality of wires 71 is formed as wedge bonds. During wedge bonding, pressure and ultrasonic forces are applied to a wire to form a wedge bond on a bond pad of the first type of pad 50 and the second type of pad 60. In alternative embodiments, ball bonds may be used for the plurality of wires 71. With ball bonding, a metal ball is first formed by melting the end of the wire. The ball is placed on the bond pad of the first type of pad 50 and pressure, heat, and ultrasonic forces are applied to the ball for a specified amount of time.

In one or more embodiments, the wire bond material for the plurality of wires 71 may comprise copper, aluminum, and gold, among others. In other embodiments, the wire bond material may comprise tungsten, titanium, tantalum, ruthenium, nickel, cobalt, platinum, silver, and such other materials.

The semiconductor die 5, the package substrate 25, and the plurality of wires 71 may all be embedded in an encapsulant 24. In various embodiments, the encapsulant 24 comprises a dielectric material and may include a mold compound in one embodiment. In one or more embodiments, the encapsulant 24 may comprise one or more of a polymer, a copolymer, a biopolymer, a fiber impregnated polymer (e.g., carbon or glass fibers in a resin), a particle filled polymer, and other organic materials. In still other illustrative examples, the encapsulant 24 may comprise a sealant not formed using a mold compound, and materials such as epoxy resins and/or silicones. In various embodiments, the encapsulant 24 may be made of any appropriate duroplastic, thermoplastic, a thermosetting material, or a laminate, and may include filler materials in some embodiments. In another embodiment, the encapsulant 24 may comprise epoxy material and a fill material comprising small particles of glass or other electrically insulating mineral filler materials like alumina or organic fill materials.

FIG. 2B illustrates a cross-sectional view of a portion of a semiconductor device in accordance with an alternative embodiment of the present invention.

Embodiments of the present invention may be applied to form multiple level pads. For illustration, FIG. 2B illustrates a pad having three levels. The first region 1 has a first type of pad 50, the second region 2 has a second type of pad 60, and the third region 3 has a third type of pad 64. As illustrated in FIG. 2B, the third type of pad 64 is formed within three levels. Each level is formed using a separate mask step. The lower most level comprises the fill metal 172 and may be used for electrical contact pads. The second level comprises the second fill metal 173 and may be formed by a separate patterning and deposition process. An additional third level comprises a third fill metal 176 that may be formed using a further patterning and deposition process. For example, the second region 2 may comprise finer pitch structures than the third region 3 because of which the thickness of the second fill metal 173 may be limited. Alternately, the devices in the third region 3 may run hotter than the second region 2 and may require a thicker metal for proper cooling.

FIGS. 3A-3L illustrate cross-sectional views of a semiconductor device during various stages of processing in accordance with a process for making the semiconductor device in accordance with embodiments of the present invention.

Figure 3A:
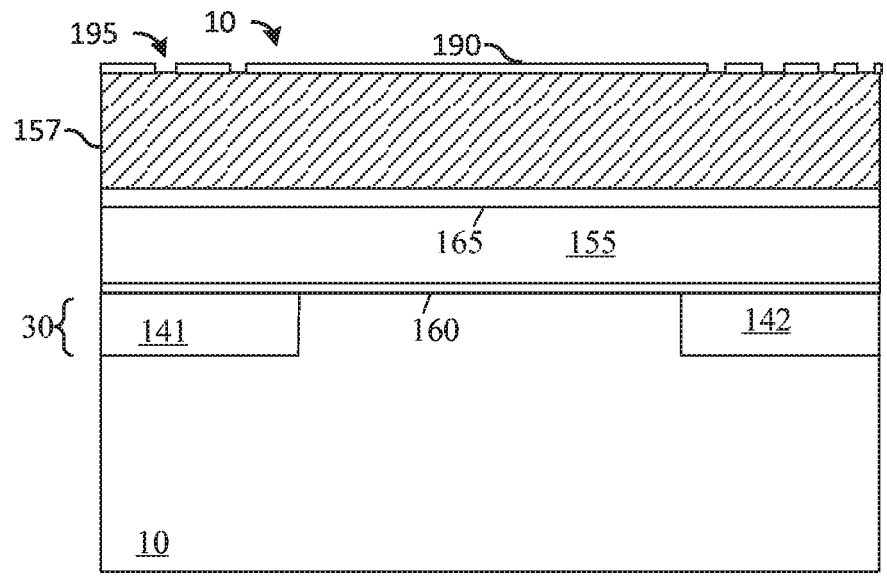
FIGS. 3A-3L illustrates cross-sectional views of a semiconductor device during various stages of processing in accordance with a process for making the semiconductor device in accordance with embodiments of the present invention.

FIG. 3A illustrates a cross-sectional view of a semiconductor device during back end metallization. After forming the active regions and doped regions in and over the substrate 10, metallization levels are formed over the substrate 10.

In various embodiments, the metallization levels that include metal line levels and via levels may be formed using damascene or dual damascene processes. Further in alternative embodiments, the metallization levels may be formed using a fill process, and/or silicide process.

A plurality of landing pads 30 is formed at the upper most metal level. The plurality of landing pads 30 comprise a first landing pad 141 and a second landing pad 142. The plurality of landing pads 30 are formed within the fourth insulating layer in various embodiments.

A first etch stop layer 160 may be formed over the plurality of landing pads 30 followed by an inter-level dielectric layer 155 (e.g., fifth insulating layer 20 in FIG. 1). The etch stop layer may also be a diffusion barrier to prevent the metal from diffusing into the dielectric material. The first etch stop layer 160 is deposited in one embodiment using a physical vapor deposition process. For example, a nitride film (e.g., silicon nitride) is deposited in one embodiment. In various embodiments, such layers may be used to cap the metal lines and may comprise dielectric materials such as silicon nitride (SiN), silicon carbide (SiC), silicon carbo nitrides (SiCN) or other suitable dielectric barrier layers or combinations thereof. In various embodiments, the first etch stop layer 160 may comprise an oxide, a nitride, or an oxynitride such as silicon dioxide, silicon nitride, silicon oxynitride, and others. In alternative embodiments, the first etch stop layer 160 may comprise boron doped layers includes BPSG, boron nitride, silicon boron nitride, silicon carbon nitride, silicon germanium, germanium, carbon based layers such as amorphous carbon. In further embodiments, the first etch stop layer 160 may comprise silicon carbide including SiC:H comprising various combinations of C—H, Si—H, Si—CH$_3$, Si—CH$_2$)$_n$, and Si—C.

The inter-level dielectric layer 155 may comprise an insulating layer as described previously with respect to the first insulating layer 16 in FIG. 1A. For example, the inter-level dielectric layer 155 comprises insulating materials such as SiO$_2$, tetra ethyl oxysilane (TEOS), fluorinated TEOS (FTEOS), doped glass (BPSG, PSG, BSG), organo silicate glass (OSG), fluorinated silicate glass (FSG), spin-on glass (SOG), SiN, SiON, or low k insulating materials, e.g., having a dielectric constant of about 4 or less, or combinations or multiple layers thereof, as examples, although alternatively, the inter-level dielectric layer 155 may comprise other materials. The inter-level dielectric layer 155 may also comprise dense SiCOH or a porous dielectric having a k value of about 3 or lower, as examples. The inter-level dielectric layer 155 may also comprise an ultra-low k (ULK) material having a k value of about 2.3 or lower, for example. The inter-level dielectric layer 155 may comprise a thickness of about 500 nm or less, for example, although alternatively, the inter-level dielectric layer 155 may comprise other dimensions.

A second etch stop layer 165 is deposited over the inter-level dielectric layer 155. A first masking layer 190 is formed over the inter-level dielectric layer 155 and a resist layer 157. The resist layer 157 may include multiple layers and may also include a hard mask layer. The resist layer 157 or the first masking layer 190 may also include antireflection coating layer. The first masking layer 190 may be, for example, a photoresist layer.

The first masking layer 190 may be patterned using a lithography process in various embodiments. In one embodiment, an opening 195 is formed through the first masking layer 190 to expose the resist layer 157.

Figure 3B:
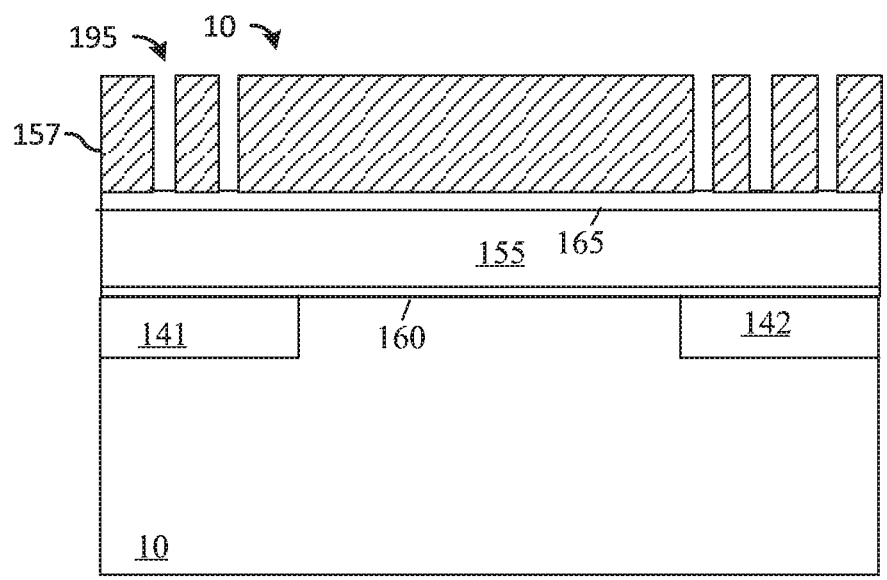
Figure 3C:
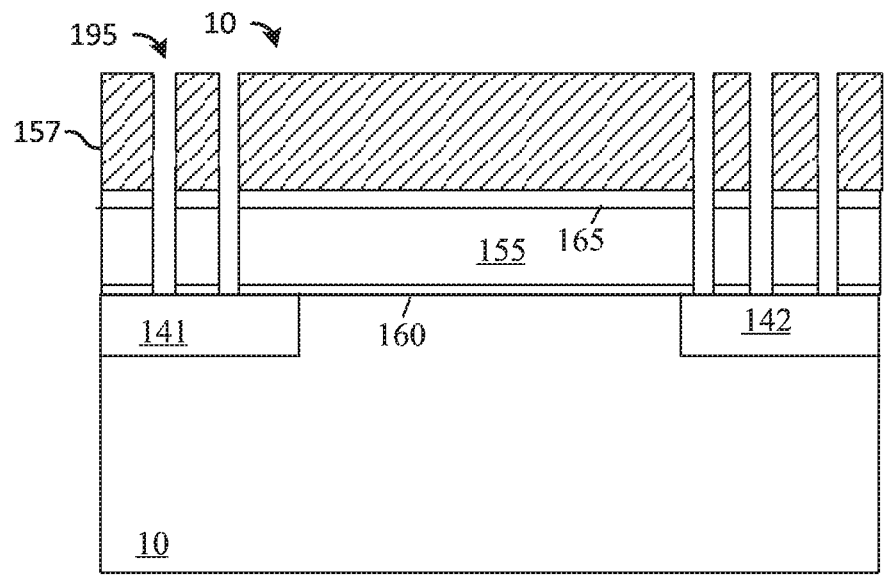

Using the patterned first masking layer 190 as an etch mask, the resist layer 157 is etched further down as shown in FIG. 3B. The etch process may be continued, although after changing the etch chemistry, to etch through the inter-level dielectric layer 155. In various embodiments, an anisotropic etch process such as reactive ion etching is used. The exposed first etch stop layer 160 may be removed by a wet etching process, for example.

Figure 3D:
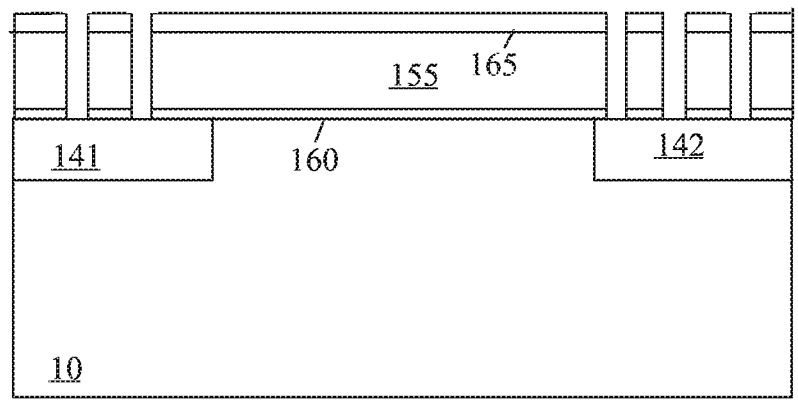
Figure 3E:
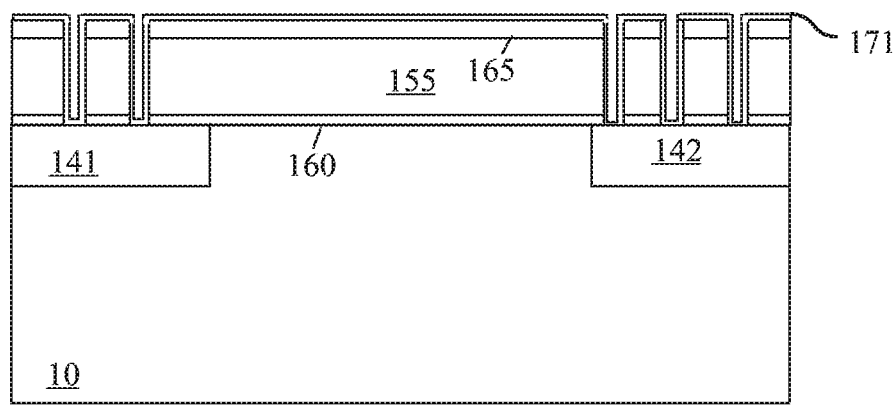
Figure 3F:
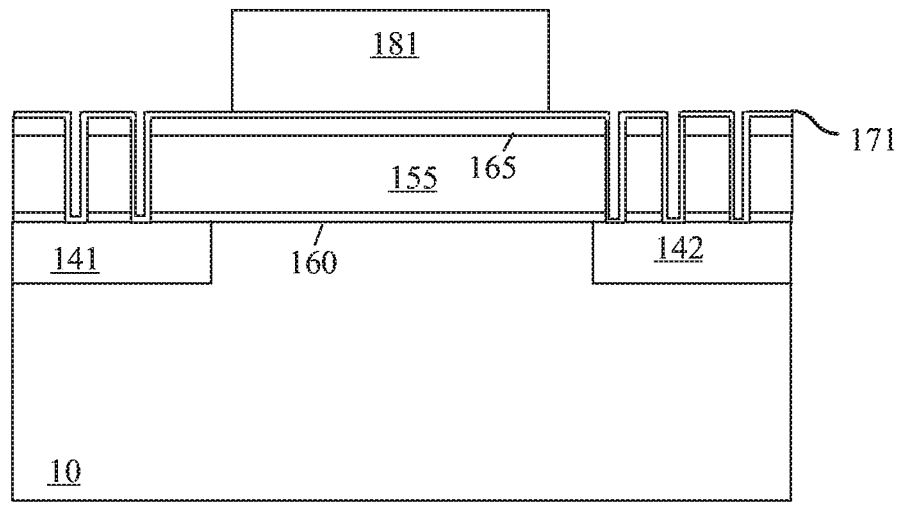

Referring to FIG. 3D, the resist layer 157 is removed exposing the second etch stop layer 165. As next illustrated in FIG. 3E, a conductive liner 171 is deposited within the opening 195 and over the top surface of the second etch stop layer 165. The conductive liner 171 may comprise multiple layers in various embodiments. For example, the conductive liner 171 may include an adhesion layer, a diffusion barrier layer and followed by a seed layer. The diffusion barrier layer may be configured to prevent the diffusion of copper into the underlying layers. In further embodiments, the conductive liner 171 may also comprise a barrier layer for the solder metal that is used to contact the to be formed pads. As an example, the diffusion barrier metal of the conductive liner 171 may comprise a tungsten-titanium, titanium, titanium nitride, tantalum, tantalum nitride, tungsten, tungsten nitride, tungsten carbo nitride (WCN), ruthenium or other suitable conductive nitrides or oxides.

A seed layer may be deposited over the diffusion barrier layer. In various embodiments, the seed layer may be used for subsequent deposition process such as an electrochemical deposition process. Accordingly, in one embodiment, the seed layer comprises a copper layer.

In one embodiment, the conductive liner 171 comprises a diffusion barrier layer of tungsten titanium deposited by physical vapor deposition (PVD) and followed by a seed layer comprising copper. The conductive liner 171 may also include under bump metallization and accordingly include a solder metal barrier such as nickel vanadium, pure nickel, Referring to FIG. 3F, a second resist layer 181 is deposited and patterned using, for example, conventional lithographic processes. For example, the second resist layer 181 may be exposed and developed using a photolithographic process. The second resist layer 181 may have a thickness of about 5 μm to about 30 μm in various embodiments, and about 10 μm to about 20 μm in one embodiment.

Using the exposed seed layer of the conductive liner 171, a fill metal 172 is deposited over the conductive liner 171. For example, an electrochemical deposition process is used to deposit the fill metal 172. In various embodiments, copper is electro-plated to form the fill metal 172. The fill metal 172 may comprise a thickness of about 4 μm to about 25 μm in various embodiments, and about 5 μm to about 15 μm in one embodiment. The fill metal 172 is less thick relative to the second resist layer 181.

Figure 3G:
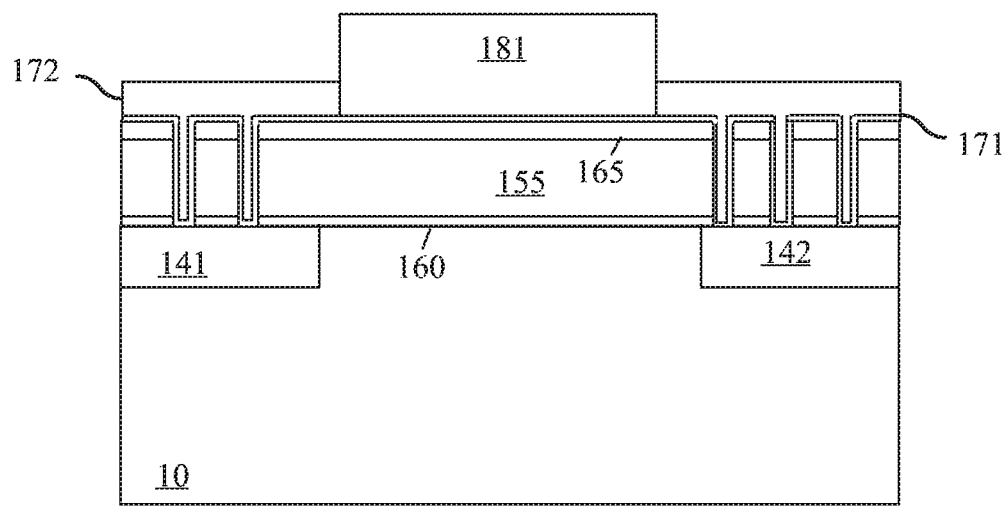
Figure 3H:
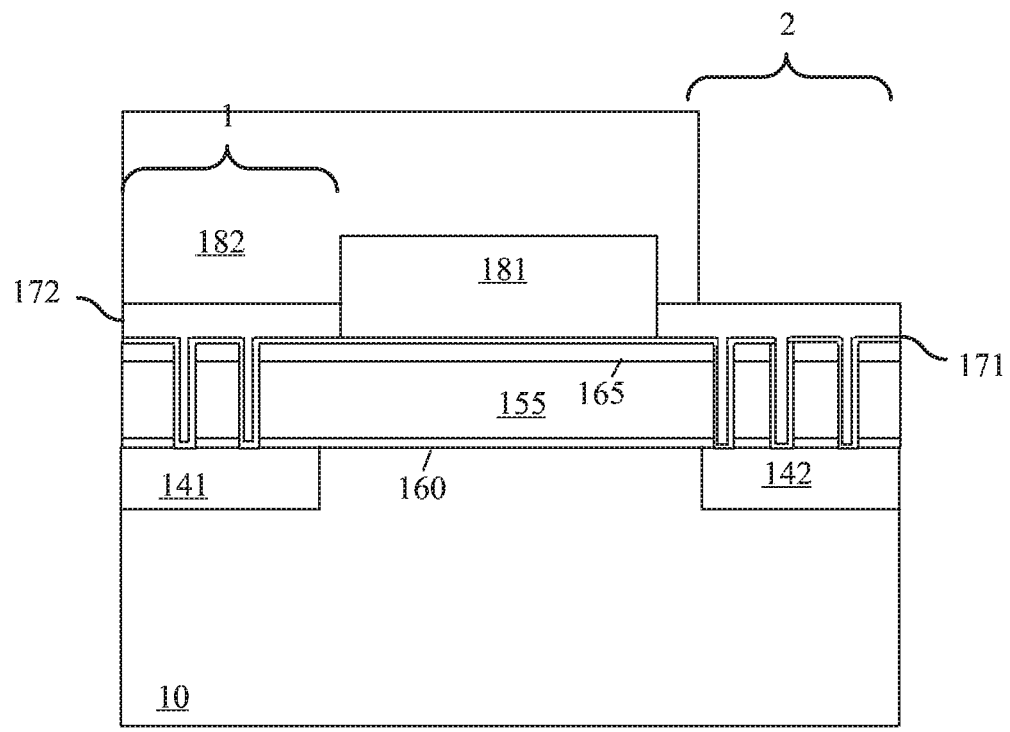
Figure 3I:
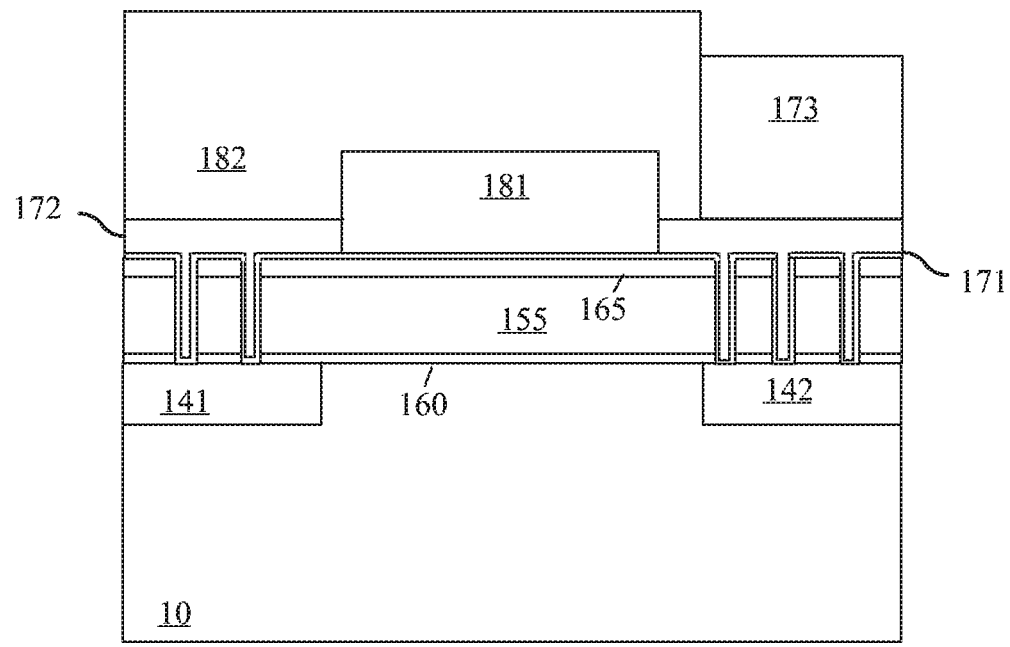

Referring to FIG. 3H, a third resist layer 182 is deposited and patterned using, for example, conventional lithographic processes. For example, the third resist layer 182 may be exposed and developed using a photolithographic process. The third resist layer 182 may have a thickness of about 30 μm to about 80 μm in various embodiments, and about 40 μm to about 60 μm in one embodiment. The patterning of the third resist layer 182 exposes a top surface of the fill metal 172, for example, over the second landing pad 142.

Accordingly, in various embodiments, different design layouts and different thickness of resists may be used as necessary. Thick resists are only needed in the second region 2 where thicker metal is being deposited. This avoids the need for patterning a thick resist layer over fine pitch structures.

In an alternative embodiment, the second resist layer 181 may be removed and the third resist layer 182 may be deposited and patterned to expose a top surface of the fill metal 172, for example, over the second landing pad 142.

Using the top surface of the fill metal 172, a second fill metal 173 is deposited over the fill metal 172. For example, an electrochemical deposition process is used to deposit the second fill metal 173. In various embodiments, copper is electro-plated to form the second fill metal 173. The second fill metal 173 may comprise a thickness of about 15 μm to about 50 μm in various embodiments, and about 25 μm to about 35 μm in one embodiment.

In various embodiments, the second fill metal 173 is a different type of material than the fill metal 172. For example, the second fill metal 173 may have a larger porosity than the fill metal 172. Alternatively, the second fill metal 173 may be less dense compared to the fill metal 172. In another example, the second fill metal 173 may be doped differently than the fill metal 172. In yet another example, the second fill metal 173 may comprise larger grains than the fill metal 172.

Figure 3J:
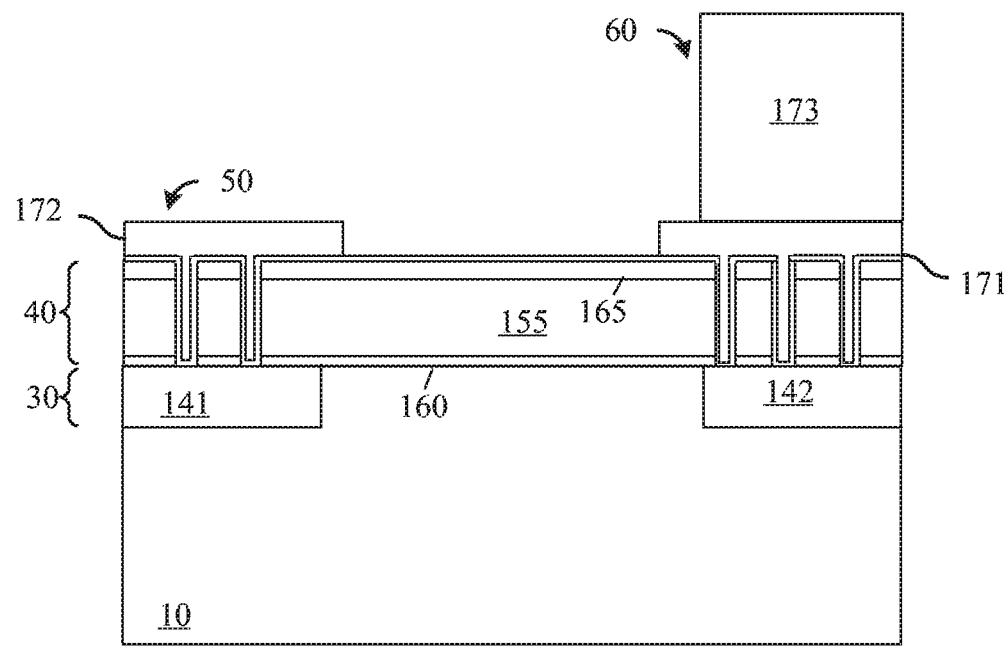
Figure 3K:
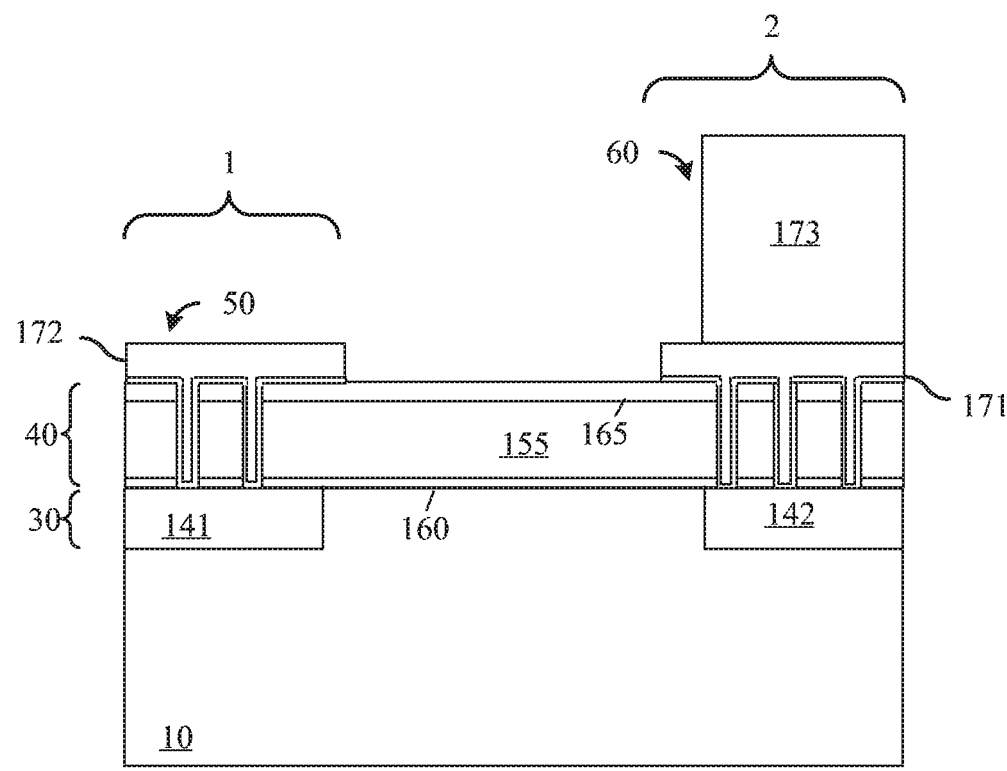

Referring to FIG. 3J, the third resist layer 182 and the second resist layer 181 are removed exposing the conductive liner 171, i.e., the seed layer. The exposed conductive liner 171 may then be removed using an etch process as illustrated in FIG. 3K. The conductive liner 171, which may include multiple layers such as the barrier layer and the seed layer, may be etched without additional masks steps because a small amount of etching of the fill metal 172 and the second fill metal 173 during the etching of the conductive liner 171 is acceptable.

Figure 3L:
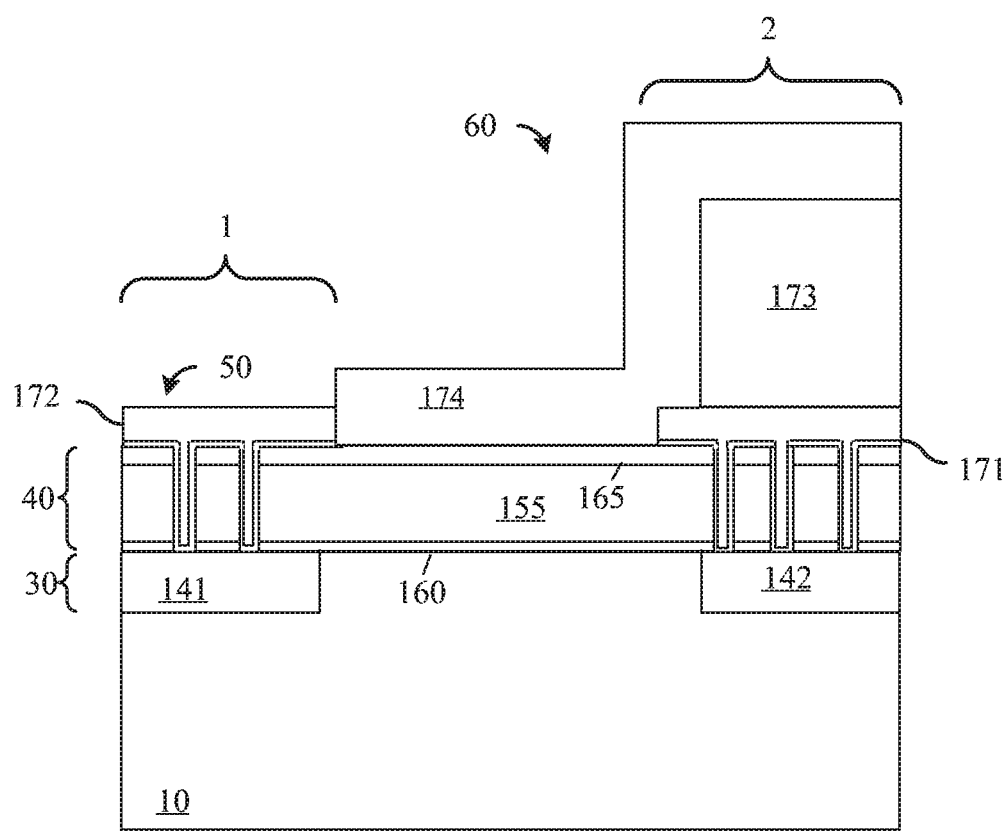

Referring to FIG. 3L, a protective layer 174 may be deposited exposing only the electrical contacts. The protective layer 174 may comprise an imide layer in one example.

Conventional devices have a thick power metal across the whole device. The thick layers of power metal introduce large stress at the interface with the underlying vias (e.g., plurality of vias 40 in the via level). Such high stress can result in delamination with the plurality of vias 40. Advantageously, embodiments of the present invention avoid delamination issues due to the thick power metal. This is because as described above, the second fill metal 173 is formed only in the second region 2 but not in the first region 1. Accordingly, in various embodiments, large areas of the semiconductor device do not have the thicker second fill metal 173. The lower amount of power metal reduces the high stress areas in the device and therefore results in less failure due to delamination of the thick power metal.

FIGS. 4A-4E illustrate cross-sectional views of a semiconductor device during various stages of processing in accordance with an alternative embodiment for fabricating the semiconductor device. Embodiments of the present invention may also be applied to subtractive deposition processes as further described using FIGS. 4A-4E.

This embodiment follows the prior embodiment up to FIG. 3G. For example, the process steps may be similar to the embodiment illustrated in FIGS. 3A-3G. Subsequently, instead of depositing and patterning another resist layer, the second resist layer 181 is removed.

The removal of the second resist layer 181 is followed by the deposition of a second conductive liner 201. Similar to the prior conductive liner described above, the second conductive liner 201 may include multiple layers. Similar to the conductive liner described previously, the second conductive liner 201 may, for example, include a diffusion barrier layer and a copper seed layer for subsequent electrochemical deposition. In one embodiment, the second conductive liner 201 comprises a diffusion barrier layer of tungsten titanium deposited by physical vapor deposition (PVD) and followed by a seed layer comprising copper.

The second conductive liner 201 is deposited as a blanket layer in various embodiments. A third fill metal 202 is deposited over the second conductive liner 201. The third fill metal 202 may comprise copper in one embodiment and may be electroplated. In another embodiment, the second conductive liner 201 may comprise a diffusion barrier and is followed by the deposition of aluminum.

A planarization process such as chemical mechanical polishing process may be used to form a substantially planar surface after depositing the third fill metal 202.

Figure 4A:
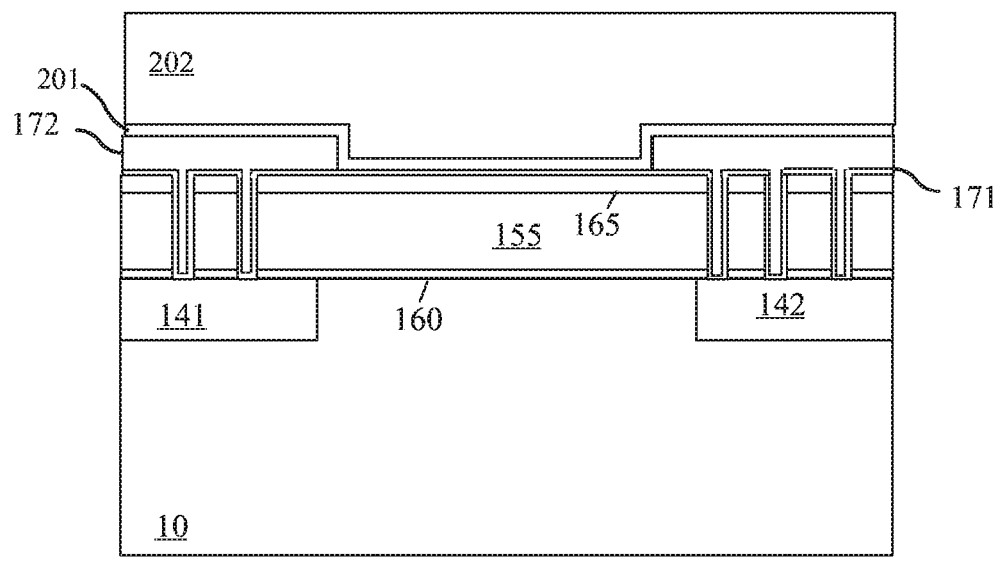
FIGS. 4A-4E illustrate cross-sectional views of a semiconductor device during various stages of processing in accordance with an alternative embodiment for fabricating the semiconductor device.
Figure 4B:
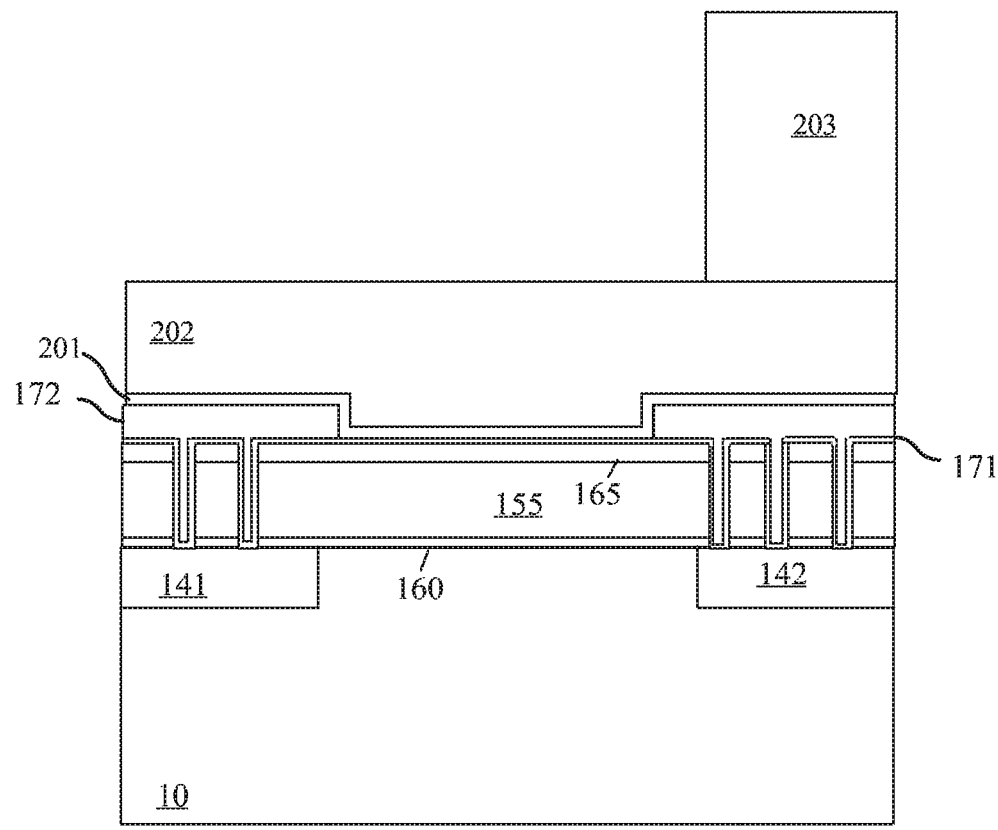

Referring to FIG. 4B, a fourth resist layer 203 is deposited over the third fill metal 202. The fourth resist layer 203 is patterned and the resist material not overlying the second landing pad 142 is removed so as expose the third fill metal 202.

Figure 4C:
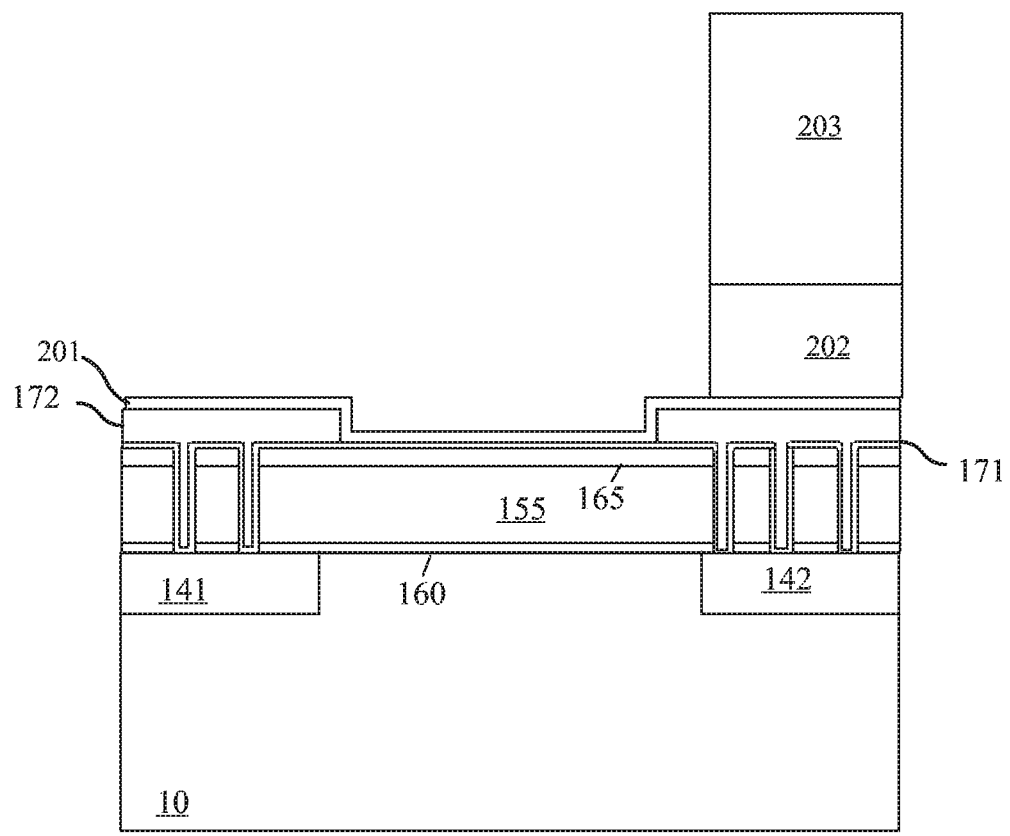

As next illustrated in FIG. 4C, the exposed third fill metal 202 is removed using an etching process. The etching process may be an anisotropic etching process such as reactive ion etching in one embodiment or a wet etching process in case of copper based metal layers because it may be difficult to etch copper with a plasma. The etching process may be designed to stop at the second conductive liner 201 as illustrated in FIG. 4C.

The etching process may also create some undercut beneath the fourth resist layer 203. However, because the variation in widths of the pads is minimal, the lateral undercut will be consistent between the pads in the second region 2 and can be compensated easily. Because only similarly shaped pads are being removed, the etching process is easier. In contrast, if fine pitch structures have also to be patterned using an etching process, very fine tolerance is needed.

Accordingly, in one or more embodiments, since the third fill metal 202 is not being used for electrical connectivity, the design requirements for the third fill metal 202 are much more relaxed. Thus, even a subtractive process may be used for depositing the third fill metal 202.

Figure 4D:
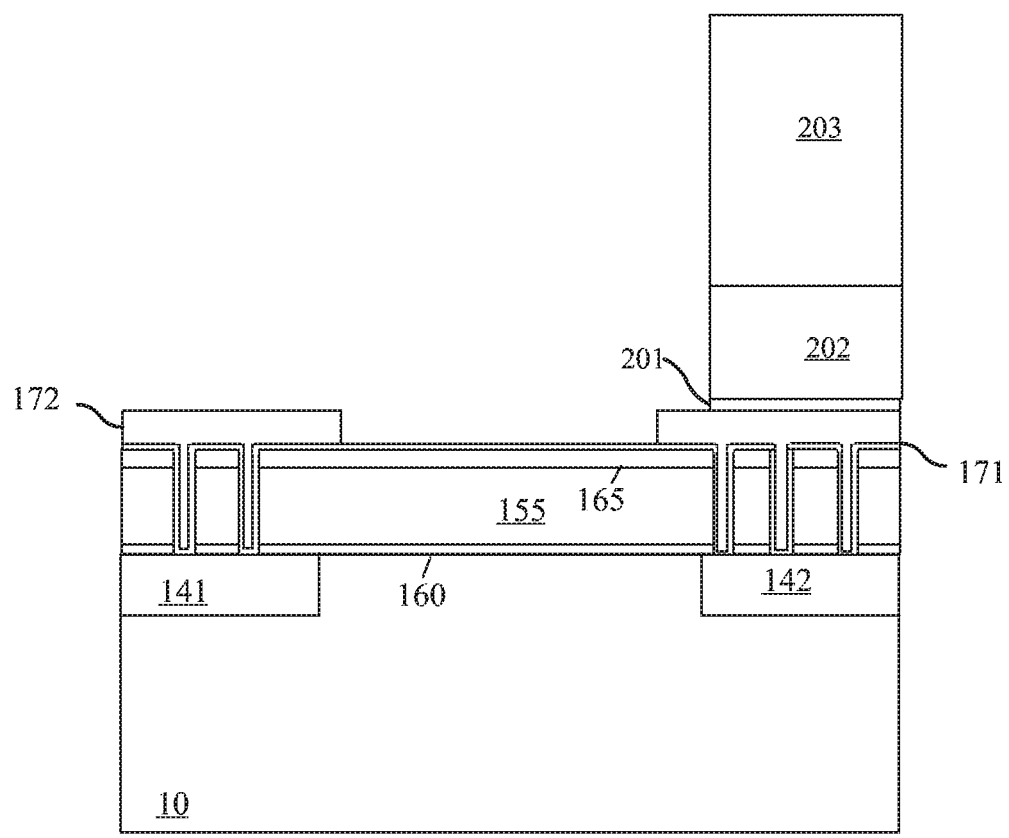
Figure 4E:
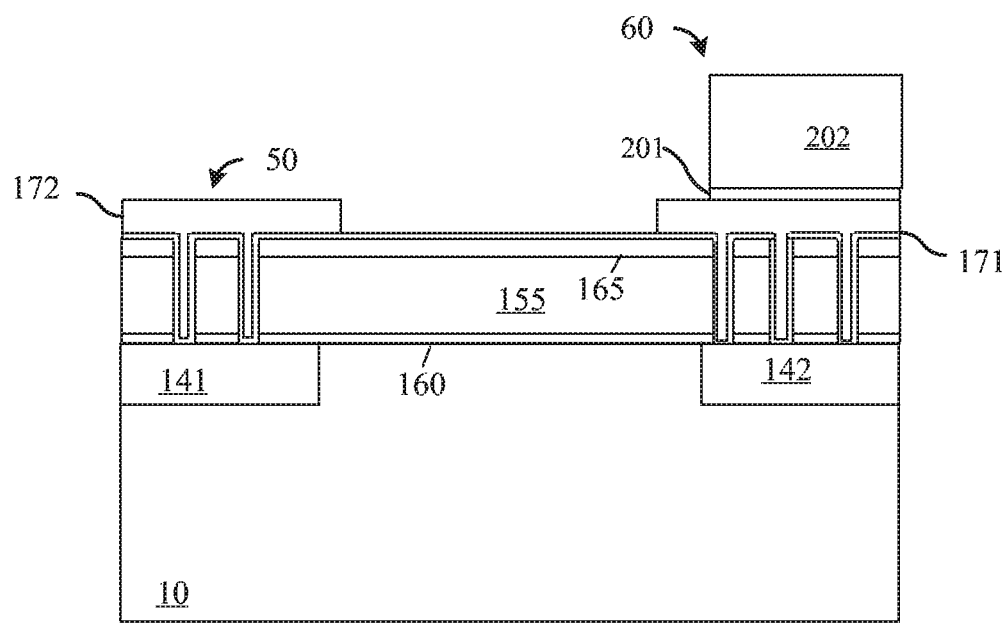

Referring to FIG. 4D, the exposed second conductive liner 201 is removed using for example, another etching process. In one embodiment, the third fill metal 202 and the second conductive liner 201 may be removed using a common process. As next illustrated in FIG. 4E, the fourth resist layer 203 may be removed.

Accordingly, a multilayer deposition by stacking of different metal in different design layouts enables now a sequential deposition of a thin layer for fine pitch designs and contacts followed by a thicker layer directly over chip areas that need to be cooled.

Further processing continues as described in earlier embodiments, for example, by the deposition of a protective layer.

The present invention has been described with respect to various embodiments in a specific context, namely depositing conductive pads having different thicknesses. Embodiments of the present invention may also be applied, however, to other instances where thick layers of metal or other materials are removed without harming adjacent structures. Similarly, embodiments of the invention may be applied to other processes such as wafer level processes for forming redistribution lines, which connect adjacent circuitry in a system on chip device. For example, redistribution lines of power devices may be thicker than redistribution lines of standard devices in one embodiment.

As described in various embodiments, a material that comprises a metal may, for example, be a pure metal, a porous metal, a metal alloy, a metal compound, an intermetallic and others, i.e., any material that includes metal atoms.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-4 may be combined with each other in various embodiments. It is therefore intended that the appended claims encompass any such modifications or embodiments.

What is claimed is:

1. A semiconductor device comprising:
   a first region in a substrate comprising a transistor;
   a second region in the substrate comprising a power transistor, the power transistor configured to operate at a higher voltage than the transistor in the first region;
   a first pad disposed over the first region, the first pad being coupled to the transistor in the first region; and
   a second pad disposed over the second region, the second pad being coupled to the power transistor in the second region, wherein the first pad comprises a first thickness and the second pad comprises a second thickness different than the first thickness, wherein the second pad comprises a lower pad portion and an upper pad portion disposed over the lower pad portion, wherein the lower pad portion has a larger area than the upper pad portion.

2. The device of claim 1, wherein the lower pad portion has a smaller thickness than the upper pad portion.

3. The device of claim 1, wherein the lower pad portion and the first pad comprise a same material.

4. The device of claim 1, wherein the lower pad portion is a different type of material than the upper pad portion.

5. The device of claim 1, wherein the upper pad portion is more porous than the lower pad portion.

6. The device of claim 1, wherein the upper pad portion comprises a first outer sidewall and an opposite second outer sidewall, wherein the first outer sidewall is offset from a corresponding first outer sidewall of the lower pad portion, and wherein the second outer sidewall is offset from a corresponding second outer sidewall of the lower pad portion.

7. The device of claim 1, further comprising:
a protective layer coating a major outer surface of the upper pad portion.

8. The device of claim 1, wherein the lower pad portion comprises less than 1% pores by volume while the upper pad portion comprises pores larger than 5% by volume.

9. The device of claim 1, wherein the lower pad portion comprises a heavily doped copper layer while the upper pad portion comprises less doping than the lower pad portion.

10. The device of claim 1, wherein the upper pad portion comprises larger grains than the grains of the lower pad portion.

11. The device of claim 1, wherein the lower pad portion comprises a different sulfuric content than the upper pad portion.

12. A method for fabricating a semiconductor device, the method comprising:
forming a first pad in a first region and a lower pad portion of a second pad in a second region, the first pad being coupled to a transistor in the first region; and
forming an upper pad portion of the second pad in the second region, the second pad being coupled to a power transistor in the second region, the second pad being thicker than the first pad, the second pad comprising the lower pad portion and the upper pad portion above the lower pad portion, wherein an area of the upper pad portion is less than an area of the lower pad portion.

13. The method of claim 12, wherein the lower pad portion has a smaller thickness than the upper pad portion.

14. The method of claim 12, wherein the lower pad portion and the first pad comprise a same material.

15. The method of claim 12, wherein the lower pad portion is a different type of material than the upper pad portion.

16. The method of claim 12, wherein the upper pad portion is more porous than the lower pad portion.

17. The method of claim 12, wherein the upper pad portion comprises a first outer sidewall and an opposite second outer sidewall, wherein the first outer sidewall is offset from a corresponding first outer sidewall of the lower pad portion, and wherein the second outer sidewall is offset from a corresponding second outer sidewall of the lower pad portion.

18. The method of claim 12, further comprising:
a protective layer coating a major outer surface of the upper pad portion.

19. The method of claim 12, wherein the lower pad portion comprises less than 1% pores by volume while the upper pad portion comprises pores larger than 5% by volume.

20. The method of claim 12, wherein the lower pad portion comprises a heavily doped copper layer while the upper pad portion comprises less doping than the lower pad portion.

21. The method of claim 12, wherein the upper pad portion comprises larger grains than the grains of the lower pad portion.

22. The method of claim 12, wherein forming the upper pad portion comprises using a different electrochemical additive in a electrochemical deposition process than that used to form the lower pad portion.

23. The method of claim 12, wherein the lower pad portion comprises a different sulfuric content than the upper pad portion.

* * * * *